United States Patent
Souriau

(10) Patent No.: US 8,466,568 B2
(45) Date of Patent: Jun. 18, 2013

(54) MULTI-COMPONENT DEVICE INTEGRATED INTO A MATRIX

(75) Inventor: Jean-Charles Souriau, Saint-Egreve (FR)

(73) Assignee: Commissariat a l'Energie Atomique, Paris (FR)

(*) Notice: Subject to any disclaimer, the term of this patent is extended or adjusted under 35 U.S.C. 154(b) by 708 days.

(21) Appl. No.: 12/505,385

(22) Filed: Jul. 17, 2009

(65) Prior Publication Data

US 2010/0047567 A1 Feb. 25, 2010

(30) Foreign Application Priority Data

Jul. 21, 2008 (FR) .................................. 08 54944

(51) Int. Cl.
*H01L 23/495* (2006.01)
*H01L 23/29* (2006.01)
*H01L 23/22* (2006.01)

(52) U.S. Cl.
USPC ............................ 257/790; 257/669; 257/687

(58) Field of Classification Search
USPC ......................................... 257/669, 687, 790
See application file for complete search history.

(56) References Cited

U.S. PATENT DOCUMENTS

| | | | |
|---|---|---|---|
| 4,322,980 A | 4/1982 | Suzuki et al. | |
| 4,958,216 A | 9/1990 | Tanaka et al. | |
| 5,353,195 A | 10/1994 | Fillion et al. | |
| 5,353,498 A | 10/1994 | Fillion et al. | |
| 5,497,033 A | 3/1996 | Fillion et al. | |
| 5,904,502 A | 5/1999 | Ference | |
| 5,909,052 A | 6/1999 | Ohta et al. | |
| 6,154,366 A | 11/2000 | Ma et al. | |
| 6,224,711 B1 * | 5/2001 | Carden et al. | 156/311 |
| 6,628,526 B1 * | 9/2003 | Oshima et al. | 361/760 |
| 6,706,553 B2 * | 3/2004 | Towle et al. | 438/106 |
| 6,953,708 B2 * | 10/2005 | Hedler et al. | 438/110 |
| 6,998,533 B2 | 2/2006 | De Samber et al. | |
| 7,060,530 B2 * | 6/2006 | Kanatake | 438/112 |
| 7,176,567 B2 * | 2/2007 | Yang et al. | 257/730 |
| 7,906,860 B2 * | 3/2011 | Meyer et al. | 257/790 |

(Continued)

FOREIGN PATENT DOCUMENTS

DE 199 07 295 2/2001
EP 0 154 431 9/1985

(Continued)

OTHER PUBLICATIONS

Chen, Chang-Lee et al., "Bond Wireless Multichip Packaging Technology for High-Speed Circuits", IEEE Transactions on Components, Hybrids, and Manufacturing Technology, vol. 15, No. 4, pp. 451-456, Aug. 1992.

(Continued)

*Primary Examiner* — James Mitchell
(74) *Attorney, Agent, or Firm* — Nixon Peabody LLP

(57) ABSTRACT

The invention relates to an electronic device, having a front face 8 and a rear face 8', fitted with at least one discrete integrated component, comprising: a) the active face 10 of the component appearing to the side of the front face 8; b) coating material 3, present at least laterally relative to the component, ensuring the so-called component is held in the device; and c) an insulating buffer layer 6, absent from the active face 10 of the component, separating the coating material 3 from this component 4.

13 Claims, 7 Drawing Sheets

U.S. PATENT DOCUMENTS

| | | | |
|---|---|---|---|
| 2004/0011699 A1* | 1/2004 | Park | 206/710 |
| 2004/0014258 A1 | 1/2004 | Nakamura | |
| 2004/0238909 A1* | 12/2004 | Boon et al. | 257/433 |
| 2005/0202590 A1* | 9/2005 | Huang et al. | 438/106 |
| 2005/0215030 A1 | 9/2005 | Yamamoto | |
| 2006/0051895 A1 | 3/2006 | Abe et al. | |
| 2006/0220222 A1 | 10/2006 | Zeng | |
| 2006/0267213 A1 | 11/2006 | Ozguz et al. | |
| 2006/0273469 A1 | 12/2006 | Beer et al. | |
| 2007/0069352 A1* | 3/2007 | Ho et al. | 257/678 |
| 2007/0080458 A1 | 4/2007 | Ogawa et al. | |
| 2007/0096305 A1 | 5/2007 | Fuergut et al. | |
| 2007/0108610 A1 | 5/2007 | Kondo | |
| 2007/0117369 A1 | 5/2007 | Val et al. | |
| 2008/0142946 A1 | 6/2008 | Yang et al. | |

FOREIGN PATENT DOCUMENTS

| | | |
|---|---|---|
| FR | 2 864 342 | 6/2005 |
| GB | 2 202 673 | 9/1988 |
| GB | 2 224 600 | 5/1990 |
| JP | 59188947 | * 10/1984 |
| WO | 00/14788 | 3/2000 |
| WO | 2004/112136 | 12/2004 |

OTHER PUBLICATIONS

Puligadda, Rama et al., "High-Performance Temporary Adhesives for Wafer Bonding Applications", Materials Research Society Symposium Proceedings, vol. 970, 0970-Y04-09, at least as early as 2007.

European Search Report for European application No. EP 09 16 5564, dated Jul. 31, 2009.

French Search Report for French publication No. FR 0755575, dated Feb. 14, 2008.

French Search Report for French publication No. FR 0854944, dated Apr. 7, 2009.

International Search Report for International Application No. PCT/EP2008/057002, mailed Sep. 26, 2008.

* cited by examiner

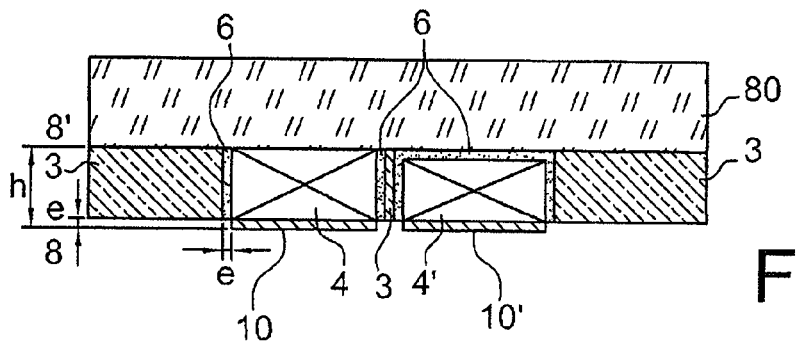
FIG. 5F
| | Parylene C | Parylene N | Parylene D |
|---|---|---|---|
| Tg in °C | 80-100°C | No data | No data |
| CTE (10-6/°) | 35 | 69 | 38 |
| Young's modulus of elasticity GPa | 2.75 | 2.41 | 2.62 |
| fusion T° | 290°C | 420 | 380 |
FIG. 6
FIG. 7A
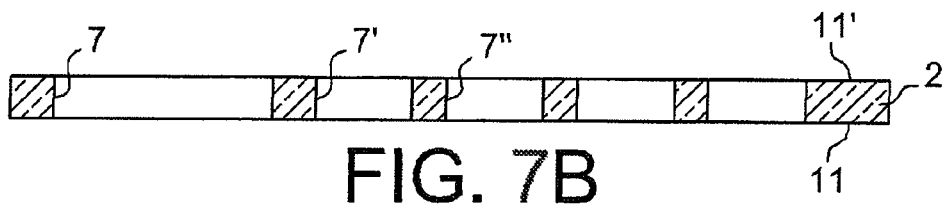
FIG. 7B

MULTI-COMPONENT DEVICE INTEGRATED INTO A MATRIX

CROSS REFERENCE TO RELATED APPLICATIONS OR PRIORITY CLAIM

This application claims priority of French Patent Application No. 08 54944, filed Jul. 21, 2008.

TECHNICAL FIELD AND PRIOR ART

The invention relates to the field of assembling Microsystems or nanosystems on the scale of a wafer, for example made of semi-conductor material such as silicon.

It relates especially to applications requiring high-density integration technologies of passive components, detectors or optoelectronic components or MEMS or NEMS directly on circuits, commonly known as "Above IC".

Currently, heterogeneous integration processes can be done only on whole silicon wafers. "Above IC" processes are thus limited to fields where the integrator of the microsystem can have wafers, involving significant costs in terms of mask sets and manufacture of wafers at a smelter.

Also, for applications such as telephony, the active surface of the integrated circuits is not sufficient to accommodate all the elements necessary for the system (passive component, amplifiers, switch, SAW or BAW components), which in particular is due to the fact that the yield decreases when the complexity of the chips increases. It is therefore necessary to assemble post fabrication the different elements on substrates of PCB (printed circuit) or ceramic type. Architectures are often complex and assembly and interconnection require many individual operations (placement of components and cabling).

There is another technique for integration of numerous functionalities on the same chip, at the same time giving good yields. In this technique a wafer is reconstituted from discrete chips placed on a support wafer then by sealing it with a coating material and removing the support wafer. This reconstituted wafer carried out integrations of "above IC" type, mixing components coming from a number of sources and assembled in a format adapted to the depositing tools available to the manufacturer. Also, this technique produces complex devices containing components made on different substrates, by selecting functional components only.

This technique, in which the active faces of the components are temporarily stuck on an adhesive, then coated and rerouted above, was published in 1992 by Chang-Lee Chen et al. in an article entitled "Bond Wireless Multipchip packaging Technology for High-Speed Circuits", appearing in "IEEE Transactions On component Hybrids and Manufacturing Technology, Vol. 15 No. 4, pages 451-456."

In this type of technique, the processes described in documents U.S. Pat. No. 5,353,498 and U.S. Pat. No. 5,497,033 are likewise known, as is the technique described in document FR 2 857 157. The technique described in document FR 2 864 342 applies to components already in a box and is highly complex, as part of the box has to be ground to take up the contacts of the components.

Finally, according to another method, described in document GB 2 202 673 and illustrated schematically in FIGS. 8A-8C, the discrete chips are placed in cavities 107 present in a receiving wafer, then sealed with coating material to form a reconstituted wafer containing the components. The technique thus presented utilises a support substrate 121 on which an adhesive film 122 is present, in a way necessary to its running. The adhesive layer holds the carrying wafer then the active chips on the support substrate during the process steps during which the filling material is not yet placed and cannot thus ensure the mechanical performance of the elements of the reconstituted wafer.

This coating layer can have three types of defects, as illustrated in FIGS. 8A-8C.

First of all, while the coating material is being deposited the material may not adhere to the adhesion layer (FIG. 8A); on the contrary, it can interact excessively with the adhesion layer, resulting in miscibility (FIG. 8B). According to case, this gives either one restraint zone or zones 113 (FIG. 8A) or mixing zones 123 of the material 103 and adhesive 122 (FIG. 8B). During shrinkage of the adhesive layer, these cases of miscibility or unwetting can lead to the coating material or components being torn off, and also to the appearance of significant constraints on the wafer or to poor performance of the components.

Different thermal expansion coefficients (TEC) between, on the one hand, the coating layer 103 (TEC close to 10 ppm/° C. or greater than this value) and, on the other hand, the substrates of the receiving wafer 102 and/or the components 104 (TEC close to 2.3 ppm/° C. for silicon) cause the appearance of strong constraints in the coating layer (FIG. 8C) during fluctuations in temperature, for example during hardening of the coating layer. These constraints cause deformation of the wafer and even ruptures. They are identified in FIG. 8C by zones 110, 110' and are located either on the periphery of the components 104, or on their rear face.

The invention aims to resolve these problems.

It aims especially to reduce the impact of the difference of TEC on the constraints in the wafer.

Another aim of the invention is to improve the interface between the device being manufactured and the adhesion layer.

EXPLANATION OF THE INVENTION

The invention first relates to an electronic device, having a front face and a rear face, fitted with at least one discrete integrated component, the active face of the component appearing to the side of the front face and comprising:
- coating material, present at least laterally relative to the component, ensuring said component is held in the device,
- a buffer layer, absent from the active face of the component, separating the coating material from the component or components.

In the case of two adjacent components, the buffer layer does not entirely fill the space between the components, the remaining space, between the components or between portions of buffer layer present on the flanks of the components, being occupied by the coating material.

In an embodiment, the component or components is (are) placed in at least one cavity present in a receiving matrix, the cavity or cavities passing through the receiving matrix, the buffer layer being at least present on the flanks of the cavity or cavities. The buffer layer thus separates the coating material from the component or components and from the receiving matrix, and is absent from the front face of the receiving matrix. It does not entirely fill the space between the flanks of the cavity or cavities and the flanks of the components.

Irrespective of the embodiment, the buffer layer has properties allowing it to limit or absorb the constraints which can appear between, on the one hand the coating material and on the other hand the component or the components and the optional wafer, during a rise and/or drop in temperatures.

According to two variants of each of the preceding devices:
the buffer layer can mask the coating material on the front face of the device;
the coating material can be visible on the front face of the device, the buffer layer being present only on the flanks of the component, the coating material and the buffer layer being or laying back relative to the active surface of the components.

The invention likewise relates to an integration process of at least one discrete integrated component into a wafer, said reconstituted wafer, a process in which:

a) at least one discrete component is positioned on a substrate, said support substrate, b) a buffer layer is then deposited at least on the rear face and the flanks of the component, said buffer layer not being deposited on the surfaces in contact with the substrate.

c) coating material is then deposited at least laterally relative to the component, this material being deposited only on surfaces covered by the buffer layer.

Step a) can comprise the positioning of one or more components in one or more cavities passing through a receiving matrix.

The formation of the buffer layer during step b) is done at least on the rear face of the matrix and the flanks of the cavity or cavities, said buffer layer not entirely filling the space between the flank of the cavities and the flank of the components, and separating, on completion of the step c), the coating material from the material of the receiving matrix.

The matrix can initially be positioned on the support substrate, then the components are positioned in the cavity or cavities of the receiving matrix. Inversely, the matrix can be placed only after the discrete components are positioned, the cavity or cavities surrounding the components.

The support substrate can be made of silicon, or glass, or alumina, or quartz.

In a process according to the invention, an adhesive layer can be deposited on the support substrate prior to step a), the buffer layer deposited at b) being deposited on at least part of the adhesive material not occupied by a component, the rear face and the flanks of the component or components and optionally on the back of the receiving matrix and the flanks of the cavities.

In a process according to the invention the buffer layer adheres advantageously to the adhesion layer and to the rear face and aux flanks of the component or components and is preferably immiscible with the adhesive layer. Thus, the buffer layer prevents formation of reaction material on the surface of the adhesive layer while keeping the different elements on the support substrate.

Also, to reduce the effects of constraints the buffer layer, for example appearing in the reconstituted wafer during above IC integration processes or during hardening of the coating material, advantageously has a vitreous transition temperature less than that of the coating material. It deforms under the influence of constraints in compression. The buffer layer also preferably has a low Young's modulus to ensure its deformation during negative variations in temperatures.

In a process according to the invention, the buffer layer can be deposited in the gaseous phase, or by ALD, or by CVD, or by sol-gel process.

In a process or a device according to the invention, the component or components has/have a support substrate, mainly made of silicon for example, or AsGa, or InP or glass. Also, each component can be a size and type different to the dimensions or type of other components integrated into the same wafer, for example of electronic component type, or MEMS or NEMS, or MOEMS or NOEMS, or bio-component, or passive component or a component acting solely as conductive passage between the front and rear faces of the device.

The buffer layer advantageously has a thickness between 10 nm and 10 µm. It can be made of PMDA-DAH or PMDA EAD or PMDA ODA, or poly-V3D3, or an organic mineral resin or parylene C or parylene N or parylene D.

In a process or a device according to the invention the coating material can be of type: epoxy or polyurethane or elastomer or silicone or acrylic or methacrylate or polypropylene or glass fusible or fusible glass type mixed with silica particles.

In a process or a device according to the invention in the case where there is a receiving matrix with cavities, the receiving matrix can be made of silicon or AsGA or InP. Also, the surface of this wafer can comprise one or more semiconductor components, including electronic components, MEMS or NEMS, MOEMS or NOEMS, or bio-components, or passive components.

BRIEF DESCRIPTION OF THE DRAWINGS

FIGS. 5A-5F are steps of an example of carrying out a process according to the invention, FIG. 6 is a table listing the properties of materials proposed as buffer layer within the scope of the invention, FIGS. 7A-7F are steps of an example of carrying out a second process according to the invention.

DETAILED EXPLANATION OF EMBODIMENTS OF THE INVENTION

Figure 1:
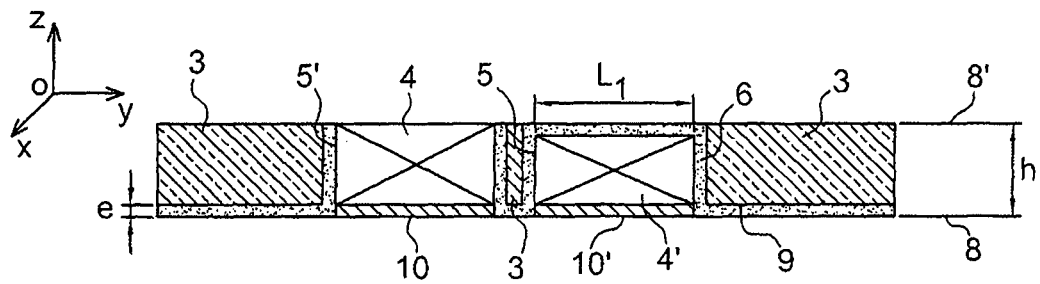
FIGS. 1, 2 and 3 illustrate examples of devices according to the invention.

Embodiments of the invention are detailed hereinbelow, illustrated by FIGS. 1 to 7 in which the reference numerals of the different elements are common to the different figures.

A first device according to the invention is illustrated in section in FIG. 1.

This device comprises one or more electronic components 4 and 4' of maximal thickness h and width L1. The active faces of the components are designated by reference numerals 10 and 10': these are faces embodying the elementary components defining the functionalities of the components or on which said elementary components are made. The faces 10 and 10' are flush with the face 8, said front face of the device. The device according to this mode, but likewise according to the other embodiments, extends substantially in a plane xy, its thickness h in the direction z, perpendicular to the plane xOy being small relative to its directions of extension in this same plane xOy, the thickness h varying from 10 µm or 300 µm to a few millimetres, for example 1 mm or 5 mm, the dimensions of the device in the plane xOy varying from 150 mm to 400 mm or even more, especially for a glass slab.

The device also comprises a buffer layer 6, present at least on the flanks 5 and 5' of the components as well as on the face 8 of the device. In this example but also in the following examples, parts of these components substantially perpendicular to the plane xOy of the device are called flanks of the components. This buffer layer has a thickness e. In the event where there is more than one component, the thickness e is selected such that it does not fully fill the space w between two components. Advantageously, e is smaller than 0.1 times w, the width of this space.

Finally, a coating or encapsulation material 3, different to the material of the buffer layer, is present, separated from the components 4 and 4' and the face 8 of the device by the buffer layer 6. Therefore, between two components along an axis parallel to the plane of the surface 8 or the plane xOy, except for a thickness e close to the surface 8, two components are separated by at least a first portion of buffer layer, a layer of coating material and a second portion of buffer layer.

One or more of the components 4 can be selected from different types of microelectronic components, for example each can be an integrated circuit, and/or a MEMS or NEMS sensor, and/or an optical component (MOEMS or NOEMS) and/or a biocomponent and/or a switch, and/or a component acting solely as conductive passage between the two faces of the device. These components can all be identical or can be different (they can especially have different thicknesses to one another).

The face 8 can then be treated by processes of microelectronic or "above-IC" type, as explained hereinbelow.

The buffer layer 6 has properties allowing it to limit or absorb the constraints which can appear between coating material on the one hand and the component or the components and the optional wafer on the other hand, during rises and/or drops in temperature.

Accordingly, this buffer layer preferably has a low Young's modulus less than that of the coating resin. This Young's module of the buffer layer is advantageously between 1.5 GPa and 10 GPa.

The buffer layer preferably has a vitreous transition temperature Tg(6) less than that of the coating material 3 Tg(3), for example between 80° C. and 150° C. (this is the case for parylene), the coating materials 3—and especially those given here by example—generally having a vitreous transition temperature between 120° C. and 220° C.

By way of example, the buffer layer can be made of PMDA-DAH or PMDA EDA or PMDA ODA or PMDA-DNB or or PMDA-PDA, or poly-V3D3 (this is poly(1,3,5-trivinyltrimethylcyclotrisiloxane)) or an organic mineral resin or parylene C or parylene N or parylene D. Advantageously, the buffer layer 6 is made of parylene C or parylene N or parylene D, the properties of which are given in the table in FIG. 6. It is recalled that PMDA is the 1,2,3,5-benzene tetracarboxylic anhydride, DNB is 2,4-diaminonitrobenzene, ODA is 4,4-oxydianiline and EDA is ethylenediamine, DAH is 1,6-diaminohexane, PDA is 1,4-phenylenediamine.

The coating material 3 advantageously has low thermal expansion coefficient (TEC), that is, for example between 5 ppm/° C. and 50 ppm/° C., more particularly less than 20 ppm/° C.

Examples of coating material 3 are epoxy resin, polyurethane, elastomer, silicon materials, acrylic, methacrylates, polypropylene, or fusible glass. To decrease the TEC of each of these materials, the choice can be made to mix it with particles, for example silica, or another type of material for the purpose of imparting to the resulting coating material electric and/or thermal and/or mechanical properties.

Figure 2:
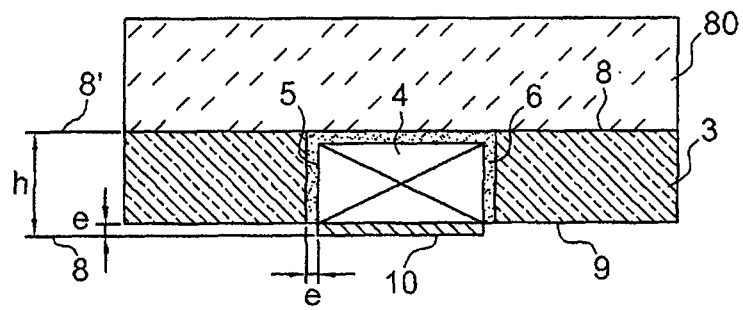

FIG. 2 illustrates a particular case of the first embodiment of the invention where the device comprises only a single component 4 which has no adjacent components. In this particular case, the buffer layer touching the surface 8 has also bee removed, exposing the surface 9 of the material 3, a thickness step e being present between the surface 10 and the surface 9. This device further comprises a reinforcing support substrate 80 stuck on the rear face of the device.

Figure 3:
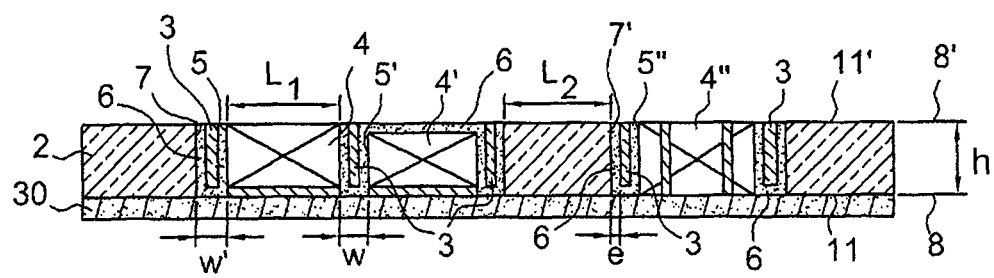

FIG. 3 illustrates a third embodiment of the invention where the different discrete components 4, 4' and 4" are placed in one or more cavities 7 and 7' made inside a matrix 2, of thickness h. It is noted that it is possible to have several components in the same cavity (this is case of the two components 4, 4' of FIG. 3). The front face 11 of the matrix 2 touches the face 8 of the device, and is thus approximately at the same level as the faces 10, 10' and 10" of the components 4. The receiving matrix is preferably made of material whereof the TEC is identical or close to that of the discrete components. It is for example made of semiconductor material such as silicon.

In the matrix 2, two adjacent cavities 7, 7' can be separated by a distance designated by $L_2$, $L_1$ designating the width of a component. Orders of magnitude for the dimensions of h, $L_1$ and $L_2$ are given hereinbelow.

In the embodiment of FIG. 3 the flanks of the cavities 7 are covered by the buffer layer 6 whereof the thickness e is selected such that it does not completely fill the spaces between two components and the intervals between the edges of the cavities 7 and the edges 5, 5' or 5" of the components. Advantageously, e is less than 0.1 times w and w', the respective widths of these intervals.

Figure 4:
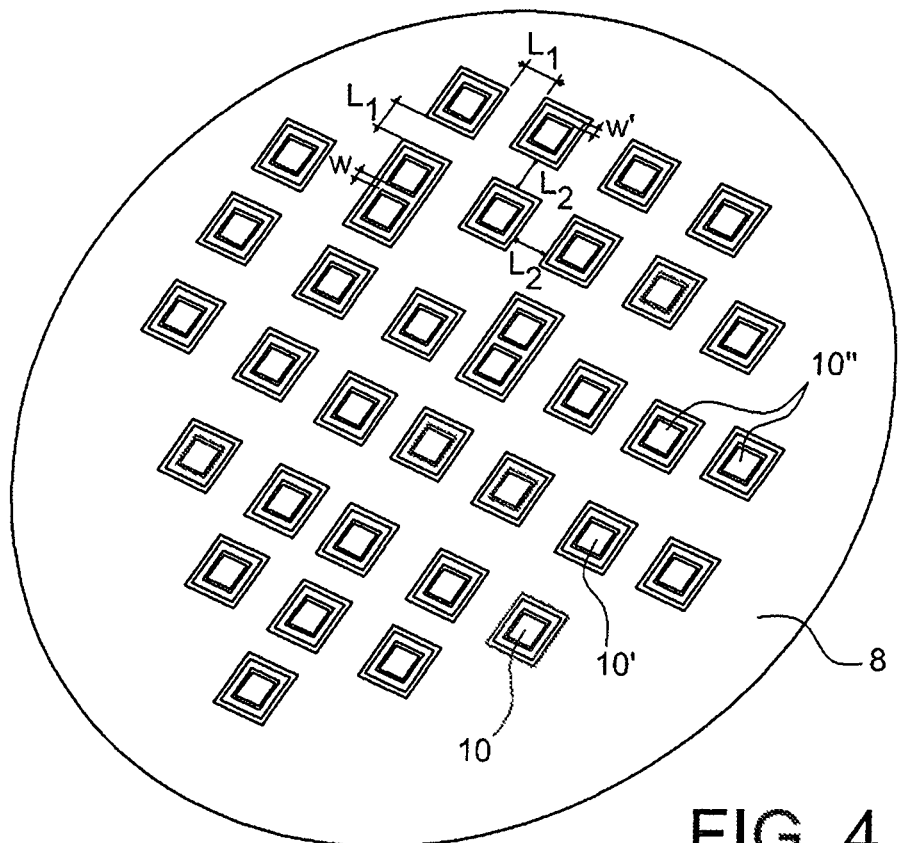
FIG. 4 illustrates one of the devices according to the invention in the form of a reconstituted wafer.

FIG. 4 illustrates an integrated device according to the invention, of the type of FIG. 3. This device comprises a support substrate constituted by the receiving matrix 2. Inserted into this matrix is a plurality of components 4, 4', 4" whereof the active surfaces 10, 10', 10" are visible, in the plane of a face 8 of the device. The different components can have different thicknesses, and in particular different to that of the matrix 2. The face 11 of the matrix 2 can have been treated (processed) prior to formation of the cavities 7. Following application of the process of the invention the reconstituted wafer of FIG. 4 can then be treated by processes of "above IC" type, as explained hereinbelow.

Examples of materials for the buffer layer and the coating layer of the embodiment of FIGS. 3 and 4 are those already given hereinabove in conjunction with FIGS. 1 and 2.

For all the examples described hereinabove, orders of magnitude for the dimensions h, w, e, $L_1$ and $L_2$ can be the following:

h can be between 10 μm and a few mm, for example of the order of 5 mm, w and w' can be between 100 μm and a few mm, these values are for example of the order of 1 mm, e can be between 10 nm and a few μm, for example of the order of 10 μm, $L_1$ can be between 100 μm and a few mm, for example of the order of 2 cm, $L_2$ can be between 100 μm and a few mm, for example of the order of 2 cm, These values are examples and other values are possible beyond the ranges indicated.

The devices described in connection with FIGS. 1, 2 and 3, with the components 4, the coating material 3, and the buffer layer 6 can, after having been made, be the object of various treatments or processes. Processes of "Above IC" type can thus be cited for examples. These processes of "Above-IC" type suitable to be made on the face 8 of the device and on the active faces 10 of the components, and optionally on the face 11 of the matrix 2, can be of type:

thin-layer integration of passive components (resistances and/or capacities and/or inductances), and/or rerouting of electric contacts and/or formation of a complex assembly of tracks and contacts between the components 4, 4' and 4". This assembly can be composed of stacks of metallic and insulating materials so as to form interconnections for example (layer 30 of FIG. 3), and/or integration, on the surface 10 of the components 4, of optical components (for example microlenses) or interconnection studs, for example by growth of fusible balls, or transfer of balls, or manufacture of "Stud Bump", or growth of micro-inserts, or hybridising of components on the wafer (Chip on Wafer).

These same treatments can be carried out on any device, comprising at least one component 4, a buffer layer 6 and coating material 3, obtained by combining all or part of the 3 embodiments described earlier.

An example of a process according to the invention will now be given, in connection with FIGS. 5A-5F. This process example especially produces the devices of FIGS. 1 and 2.

Figure 5A:
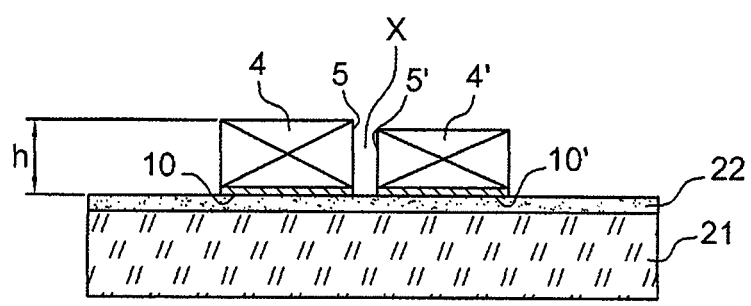

The first step is placement of the component or components 4 and 4' on a rigid and plane support 21 which is for example a support substrate made of silicon, or glass, or a quartz mask or a plate of alumina or polymer (FIG. 5A). Advantageously, this support substrate has a TEC close or even identical to that of the components 4 to ensure good positioning of the components (thus limiting displacements and/or constraints at the time of hardening of the coating material 3 (done for example by heating around 200° C.)).

The placement equipment of the component or components 4 attains micronic lateral precision, with better parallelism than $5 \cdot 10^{-4}$ rad. During subsequent integration on the face 8 these values are sufficient to take up contacts on the connection studs of the components situated on the active face which generally have a width of the order of a few tens of μm.

The temporary behaviour of the component or components on the support 21 will occur preferably due to an adhesive layer 22 deposited on the support (FIG. 5A). This layer 22 is preferably suitable for subsequent support of thermal hardening treatment of the resin 3. It could then be removed. This can for example be a resin deposited by a whirler, or a laminated adhesive film, or a photosensitive polymer, or a spray.

The components are then positioned with their active face 10 turned towards the support 21 or towards the optional adhesion layer 22 formed on the support 21. They can be aligned because of rods or marks which would have been previously fixed on the support substrate 21 or on the adhesive layer 22. There will thus be a space X between two components.

Figure 5B:
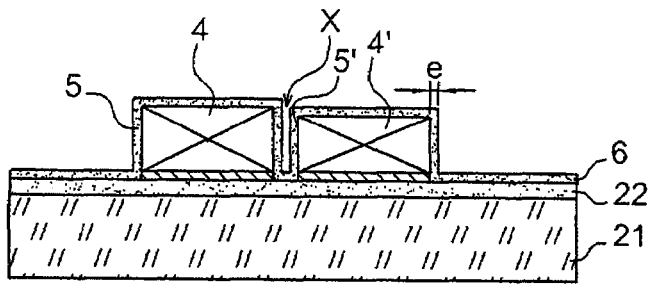

A thickness e of buffer layer 6 is then deposited with substantial conformity (FIG. 5B). This buffer layer 6 covers the rear face and the sides 5 of the component or components 4, 4', as well as the support substrate 21 (or the optional adhesive layer 22).

This layer 6 is preferably selected for its qualities of wettability and chemical inertia with the material of the support substrate 21 (and/or the optional adhesive layer 22).

Advantageously, to absorb the constraints in tension and to easily deform when the temperature drops, the buffer layer has a low Young's modulus advantageously between 1.5 GPa and 10 GPa. Inversely, to absorb the constraints in compression during annealing, this buffer layer preferably has a vitreous transition temperature Tg(6) less than the vitreous transition temperature Tg(3) of the coating material 3. Tg(6) is for example between 80° C. and 150° C., the coating materials 3 generally having a vitreous transition temperature of between 120° C. and 220° C.

The thickness e of this buffer layer 6 is selected such that it does not completely fill the spaces X between two components. It is for example selected less than 0.1 times w, w designating the width of the space X.

This buffer layer 6 can be deposited by ALD, by CVD, by sol-gel process or in gaseous phase, processes which are adapted to the desired thicknesses. Advantageously, the buffer layer 6 is made of parylene C or parylene N or parylene D whereof the properties are given in the table of FIG. 6.

Figure 5C:
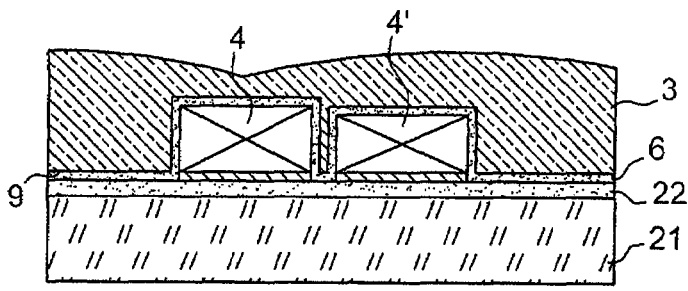

The next step is filling with the coating material 3 of the free space present between the components 4, covered by the buffer layer 6 (FIG. 5C). The material 3 is separated from the component or components, from the support substrate and from the optional adhesive layer by at least the buffer layer 6. This material 3 is for example dispensed locally by syringe or else, more roughly, by deposing one drop or large drops in a mould or by deposit by a spinner or whirler. The penetration of coating material between two components could then be facilitated by vacuuming. This coating material 3 is then cured (for example by heating).

Figure 5D:
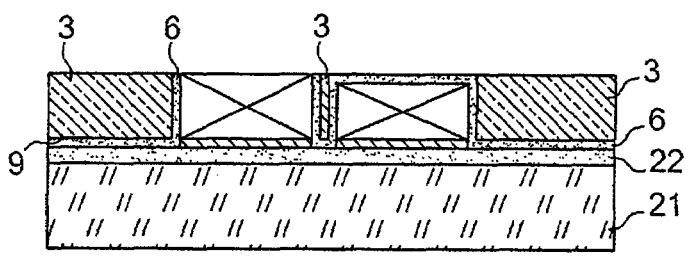

Thinning and polishing of the rear face 8' can then be completed (FIG. 5D). For certain components 4, or for all of the components 4, this thinning can eliminate the buffer layer present on the rear face of the component 4. Also, this thinning of the device can lead to reduction of the thickness of part or of all the components.

Figure 5E:
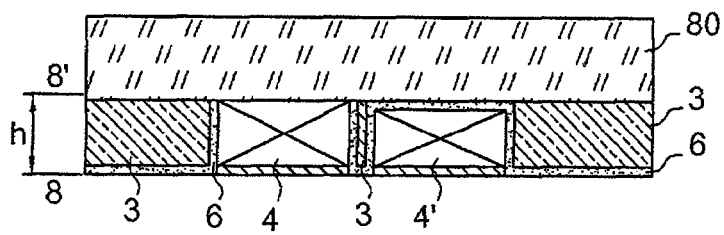

The device can be then separated from the support 21 and from the optional adhesion layer 22 (FIG. 5E). These are removed, according to their nature, by peeling, by chemical etching or by insolation of the adhesion layer 22 via the support 21 if the latter is transparent. In certain cases, the support will be maintained, especially if the support substrate 21 (and the optional adhesive layer 22) is transparent at certain wavelengths and if one or more of the components 4 is an optical component.

Before or after the removal step of the support 21 it may be feasible to stick the rear face of the device on a reinforcing support 80 to stiffen the assembly (FIG. 5E).

It is then possible to proceed on the front face 8 with elimination of a thickness e of the buffer layer 6, (FIG. 5F), thus exposing the coating material 3, in particular in the zones separating the components 4. But the material of the buffer layer is still present so as to allow separation between the coating material 3 and the flanks of the components 4; the material 3 and the buffer layer 6 thus exhibiting a thickness step e relative to the faces 10 of the component or components 4.

The device can then be introduced to a line of microelectronic type for the "Above IC" steps, for example of the type already described hereinabove.

A process according to a second embodiment of the invention is present in connection with FIGS. 7A-7F. This process inter alia produces the device of FIG. 3.

A wafer 1 is selected (FIG. 7A), made of a material having a TEC close to the TEC of the component or components. For example, it is made of AsGa or virgin silicon or it is already treated. This wafer can comprise inter alia positioning rods or marks and/or components (for example in thin layer) and/or conductive holes which pass through the wafer.

Cavities 7 are made in this wafer (FIG. 7B) by a technique such as laser etching, chemical etching or ultrasound machining, thus forming the receiving matrix 2.

The next step is placement of the component 4 in the cavities 7 (FIG. 7C); the components 4 can be of the same type as those present in the process described earlier. To this effect the receiving matrix 2 could be positioned on a rigid and plane support substrate 21, for example another wafer, made of silicon or glass or a quartz mask or a plate of alumina. Advantageously, the support substrate likewise has a TEC close or even identical to that of the receiving matrix 2 and of the component 4 to ensure good positioning of the components by limiting displacements and/or constraints at the time of hardening of the coating material 3 (carried out for example by heating around 200° C.).

Figure 7C:
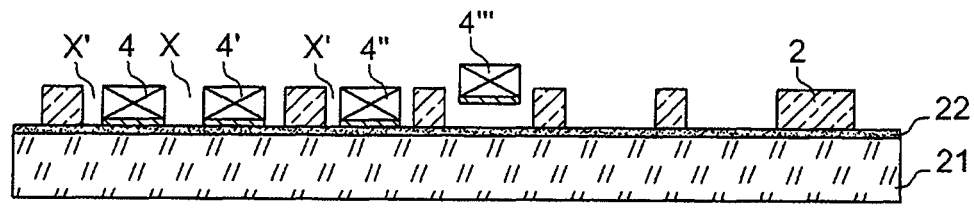

The temporary behaviour of the components and of the receiving matrix on the support 21 could be due to an adhesive layer 22 deposited on the support (FIG. 7C). This layer 22 is selected in the same way as in the first process described previously.

The components are then positioned with their active face 10 turned towards the support 21 or towards the optional adhesion layer 22 formed on the support 21. Alignment in the cavities can be done via rods or marks which will have been placed previously, either on the receiving matrix 2, or on the support substrate 21 or on the adhesive layer 22. By way of variant, it is possible to first place the components on the support 21 (or on the adhesive layer 22) and then to place the receiving matrix 2 around the positioned components.

There are spaces X and X' remaining between two components or between a component and the flanks of the cavity surrounding them.

Figure 7D:
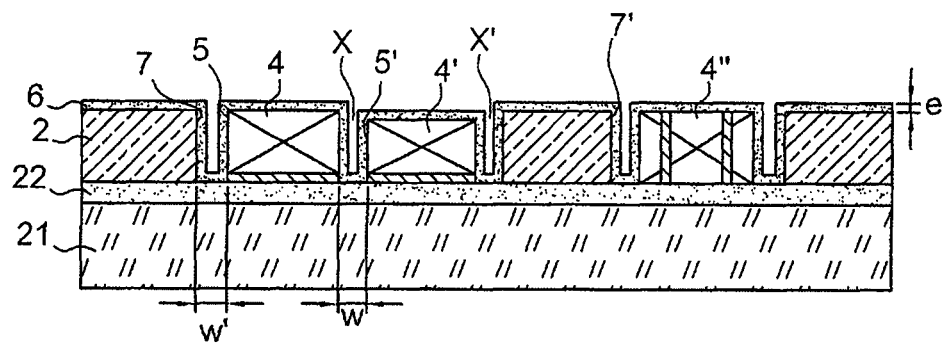
Figure 7E:
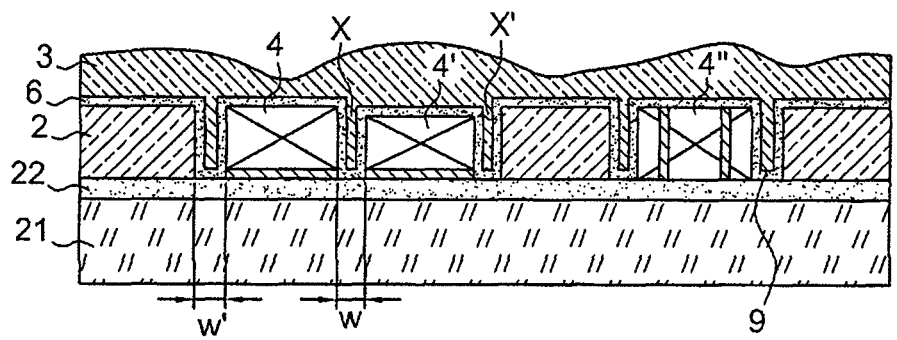

A buffer layer 6 is then deposited with substantial conformity (FIG. 7D). This buffer layer 6 covers the rear face and the sides 5 of the components, the rear face 11' of the wafer, the flanks of the cavities 7 and the support substrate 21 (or the optional adhesive layer 22). This buffer layer 6 is selected to respond to the same criteria as those cited previously and it is deposited by the same means.

The thickness e of this buffer layer is selected such that it does not completely fill the cavities X and X'. This thickness is advantageously less than 0.1 times (at least 10 times less than) w', w' designating the width of the space X', w' is of the same order of magnitude as w, width of the space X.

The next step, in each cavity 7, is filling the free space with the coating material 3 (FIG. 7E), the material 3 being placed in direct contact only with the buffer layer 6. This material is for example dispensed locally by syringe or else, more roughly, by depositing one drop or large drops onto the wafer. The penetration of the coating resin in between two components and in the cavities 7 could be facilitated by vacuuming. This filling material 3 is then cured (for example by heating).

Next come the steps of polishing the rear face and/or removal of the support substrate and/or addition of a reinforcing substrate (FIG. 7F) as in the previous embodiment.

Figure 7F:
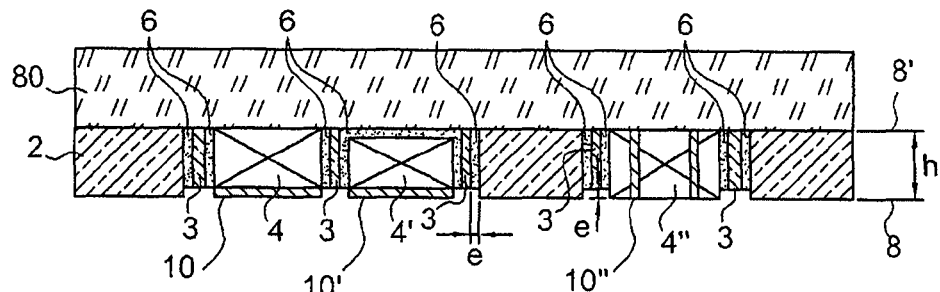
Figure 8A:
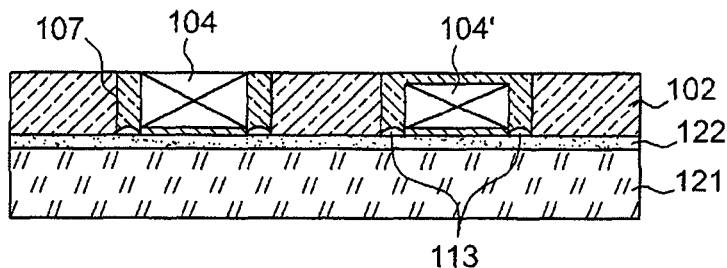
FIGS. 8A-8C illustrate the problems identified by the inventors.
Figure 8B:
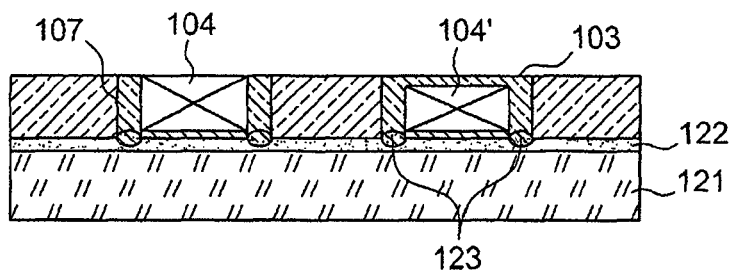
Figure 8C:
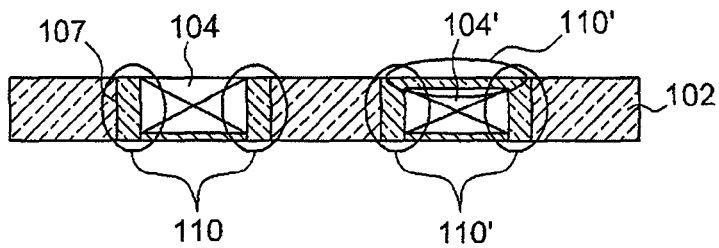

FIG. 7F illustrates the possibility of carrying out elimination of the buffer layer present on the front face of the device during or after the removal step of the support substrate. In this way, the coating material 3 is exposed, the material of the buffer layer is still present to allow separation between the coating material 3 and the flanks of the cavities 7 and of the components 4. Finally, the material 3 and the buffer layer 6 exhibit a thickness step e relative to the face 11 of the receiving matrix and the faces 10 of the component or components 4.

Next, the wafer can be reintroduced to a line of microelectronic type for the "Above IC" steps, for example of the type already described hereinabove.

Relative to the preceding process, the advantage of adding a receiving matrix is to present around the components 4 a surface on which integration of microelectronic components and/or MEMS/NEMS can already have been completed. This process realising the invention thus not only creates a multicomponent device but creates devices of "system in chip" type in which the component or the components can undergo simultaneous integration of "above-IC" type with integration of the components present initially on the receiving matrix, thus avoiding excess thickness of connections.

As is evident from FIGS. 7C to 7F, it is possible to have several components integrated into the same cavity of the receiving matrix 2.

The process illustrated by FIGS. 5A to 5F can act to integrate more than two components and this process does not make use of receiving matrix around the components, the reconstituted wafer being composed of the discrete integrated components, the buffer layer present at least laterally relative to these components and a matrix composed at least by the coating material 3.

Relative to conventional technologies of component assembly in a wafer (technique known as "Chip In Wafer"), due to the physical properties of the buffer layer the processes according to the invention minimise the constraints in the filling material which can curve the wafers. Also, these processes facilitate the industrialisation of the process by eliminating the risks of miscibility or poor wettability between the coating material 3 and the adhesion layer.

Finally, a process according to the invention mixes components 4 already tested ("Known Good Die"), having different sources and thicknesses in the same matrix 2. It is for example possible to integrate components acting solely as conductive passage between the two faces of the matrix.

Figure 9:
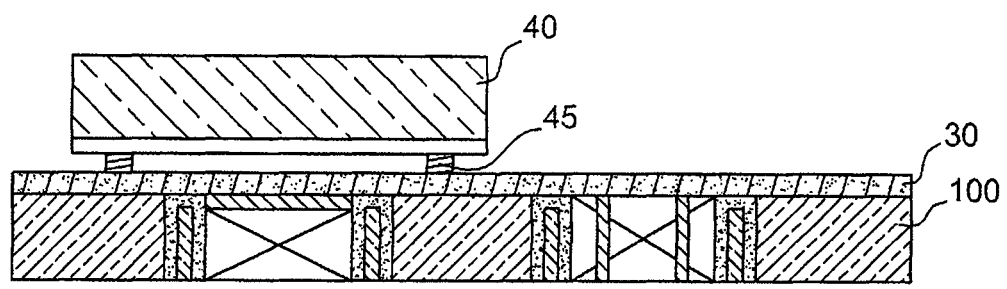
FIG. 9 illustrates an example of application of a device made according to the invention after passing into an above-IC treatment line.

FIG. 9 illustrates a case of use of a device 100 according to the invention. According to this device, there has been addition of a layer 30 deposited by "above IC" type process, this thin layer able to be composed of redistribution lines of the electric contacts, passive components of resistance, inductance, capacity type, filters, optic wave guides etc.

At least one electronic component 40 which can be of the same type as the components inserted into the reconstituted wafer has been deposited above this layer 30. This or these upper components 40 are fixed by way of connecting elements of fusible ball type 45, micro-inserts, stud-bump, polymer conductors etc.

The invention claimed is:

1. An electronic device, having a substrate with a front face and a rear face, the substrate forming a recess and fitted with at least one discrete integrated component, an active front face of the component at the front face of the device, comprising: a) coating material, present at least laterally to the component and covering sidewalls of the at least one discrete integrated component, absent from the entire active front face of the component, ensuring that said component is held in the device, b) an insulating buffer layer, absent from the active front face of the component, separating the entire coating material from said at least one integrated component.

2. The device as claimed in claim 1, the component comprising a support substrate mainly made of silicon, or AsGa, or InP or glass.

3. The device as claimed in claim 1, the coating material being of epoxy or polyurethane or elastomer or silicone or acrylic or methacrylate or polypropylene or glass fusible type or of glass fusible type mixed with particles made of silica or some other type of material with the aim of imparting electric and/or thermal and/or mechanical properties to the thus formed material.

4. The device as claimed in claim 1, the buffer layer having a thickness between 10 nm and 10 µm.

5. The device as claimed in claim 1, the buffer layer being made of PMDA-DAH or PMDA EAD or PMDA ODA, or poly-V3D3, or an organic mineral resin or parylene C or parylene N or parylene D.

6. The device as claimed in claim 1, comprising several discrete components, the buffer layer not entirely filling the space between the components, the space remaining between the components being occupied by the coating material.

7. The device as claimed in claim 1 in which:
the components are placed in at least one cavity present in a receiving matrix and passing through this receiving matrix,
the buffer layer is at least present on the flanks of the cavity or cavities, separating the coating material from the material of the receiving matrix, the buffer layer being absent from the front face of the receiving matrix, said buffer layer not entirely filling the space between the flanks of the cavity or cavities and the flanks of the components, the space remaining being occupied by the coating material.

8. The device as claimed in claim 7, the receiving matrix receiving or comprising on its surface one or more semiconductor components from among electronic components, MEMS or NEMS, MOEMS or NOEMS, bio-components, passive components.

9. The device as claimed in claim 7, the receiving matrix being made of silicon or AsGa, InP or glass.

10. The device as claimed in claim 1, the rear face of the device being fixed to a reinforcing substrate to ensure mechanical rigidity.

11. The device as claimed in claim 1 in which the buffer layer masks the coating material on the front face of the device.

12. The device as claimed in claim 1, the coating material being visible on the front face of the device, the buffer layer being present only on the flanks of the component, the coating material and the buffer layer presenting a step or a thickness step or laying back relative to the active surface of the components.

13. The device as claimed in claim 1, each component being an electronic component, or a MEMS or a NEMS, or a MOEMS or a NOEMS, or a bio-component, or a passive component or a component to form a conductive passage between the front and rear faces of the device.

* * * * *